(12) United States Patent
Matsuda et al.

(10) Patent No.: US 9,148,963 B2
(45) Date of Patent: Sep. 29, 2015

(54) LASER PROCESSING METHOD AND PRODUCTION METHOD OF MULTILAYER FLEXIBLE PRINTED WIRING BOARD USING LASER PROCESSING METHOD

(75) Inventors: Fumihiko Matsuda, Ryugasaki (JP); Yoshihiko Narisawa, Ushiku (JP)

(73) Assignee: NIPPON MEKTRON, LTD., Tokyo (JP)

(*) Notice: Subject to any disclaimer, the term of this patent is extended or adjusted under 35 U.S.C. 154(b) by 410 days.

(21) Appl. No.: 13/703,177

(22) PCT Filed: Feb. 1, 2011

(86) PCT No.: PCT/JP2011/051986
§ 371 (c)(1),
(2), (4) Date: Dec. 10, 2012

(87) PCT Pub. No.: WO2011/155229
PCT Pub. Date: Dec. 15, 2011

(65) Prior Publication Data
US 2013/0089658 A1 Apr. 11, 2013

(30) Foreign Application Priority Data

Jun. 10, 2010 (JP) ................................. 2010-132922

(51) Int. Cl.
| | |
|---|---|
| H05K 3/00 | (2006.01) |
| H05K 3/10 | (2006.01) |
| H05K 3/46 | (2006.01) |
| B23K 26/06 | (2014.01) |
| B23K 26/36 | (2014.01) |
| B23K 26/40 | (2014.01) |
| H05K 3/42 | (2006.01) |

(52) U.S. Cl.
CPC ............ *H05K 3/4685* (2013.01); *B23K 26/063* (2013.01); *B23K 26/367* (2013.01); *B23K 26/409* (2013.01); *H05K 3/0035* (2013.01); *H05K 3/4635* (2013.01); *B23K 2201/40* (2013.01); *H05K 3/421* (2013.01); *H05K 2203/108* (2013.01)

(58) Field of Classification Search
None
See application file for complete search history.

(56) References Cited

U.S. PATENT DOCUMENTS

2003/0150644 A1* 8/2003 Takada et al. .................. 174/262

FOREIGN PATENT DOCUMENTS

| CN | 1535195 A | 10/2004 |
|---|---|---|
| CN | 1972571 A | 5/2007 |

(Continued)

OTHER PUBLICATIONS

Office Action of May 6, 2014 issued to the corresponding Chinese Patent Application.

*Primary Examiner* — Lisha Jiang
(74) *Attorney, Agent, or Firm* — Jacobson Holman, PLLC.

(57) ABSTRACT

There is provided a laser processing method of forming via holes 23 and 24 by removing processed layers including a flexible insulating base member 1, in which conformal masks 7 and 8*a* are provided on the surface, and an adhesive layer 12 having a higher absorbance in a wavelength area of processing laser and a lower decomposition temperature than the insulating base member 1, the method including radiating one shot of pulse light having a first energy density that can remove the insulating base member 1 by one shot without causing the deformation and penetration of a conducting film 2A, and subsequently radiating pulse light having a second energy density that is lower than the first energy density and can remove the rest of the processed layers by a predetermined number of shots without causing the deformation and penetration of the conducting film 2A.

15 Claims, 10 Drawing Sheets

(56) References Cited

FOREIGN PATENT DOCUMENTS

| CN | 101389190 A | 3/2009 |
|---|---|---|
| JP | 03-285398 | 12/1991 |
| JP | 2000-153384 | 6/2000 |
| JP | 2002-261422 A | 9/2002 |
| JP | 2002-273590 | 9/2002 |
| JP | 2005-028369 | 2/2005 |
| JP | 2009-026912 | 2/2009 |

* cited by examiner (a)

(b)

LASER PROCESSING METHOD AND PRODUCTION METHOD OF MULTILAYER FLEXIBLE PRINTED WIRING BOARD USING LASER PROCESSING METHOD

CROSS-REFERENCE TO RELATED APPLICATIONS

This is a national stage application of PCT/JP2011/051986 filed Feb. 1, 2011 and published in Japanese, which claims the priority of Japanese application number 2010-132922 filed Jun. 10, 2010, hereby incorporated by reference.

BACKGROUND OF THE INVENTION

1. Field of the Invention

The present invention relates to a laser processing method and a production method of multilayer flexible printed wiring board using the laser processing method. Particularly, the present invention relates to a laser processing method of forming a via hole by removing multiple materials of different workability and a production method of multilayer flexible printed wiring board using the laser processing method.

2. Background Art

In recent years, as electronic devices are downsized and have higher functionality, there has been a growing demand for an increased density with respect to a printed wiring board. To realize a printed wiring board capable of high-density packaging, a buildup printed wiring board is used. Such buildup multilayer flexible printed wiring board is generally formed by using either a double-sided printed wiring board or a multilayer printed wiring board as a core board and providing one or two buildup layers on both surfaces or one surface of this core board.

Further, to increase the package density of the printed wiring board, a via is provided on the buildup printed wiring board for interlayer connection. The via is an interlayer conduction path including a plated layer formed on the internal wall of a via hole.

Types of via type include a skip via and a step via, in addition to a normal via (hereinafter referred to as "simple via") connecting wiring patterns of two adjacent layers. The skip via is formed by plating the internal wall of a skip via hole. The step via is formed by plating the internal wall of a step via hole (i.e. stepwise via hole) in which the diameter becomes smaller in a deeper internal layer of the printed wiring board (for example, see Patent Literature 1).

When first, second and third wiring patterns are formed in this order through the intermediary of an insulating film in the thickness direction of the multilayer flexible printed wiring board, the skip via skips the second wiring pattern and electrically connects the first wiring pattern and the third wiring pattern. Meanwhile, the step via enables high-density interlayer connection by collective interlayer connection of the first, second and third wiring patterns.

The via hole can be formed by a conformal laser processing method of using a mask hole (i.e. conformal mask) provided on a conductive film on a processed layer and removing a processed layer exposed in this mask hole by laser light.

However, in the related art, when the processed layer is formed of multiple materials of different workability, for example, since a resin remains in the via hole, it is difficult to form a via of high reliability. This problem will be explained in more detail with reference to the drawings.

FIG. 3A and FIG. 3B are process cross-sectional views illustrating a production method of a multilayer flexible printed wiring board in the related art.

(1) First, there is prepared a double-sided copper-clad laminate having copper foils 152 and 153 on the both surfaces of a flexible insulating base member 151 formed of a polyimide film. By processing these copper foils on the both surfaces of this double-sided copper-clad laminate into a predetermined pattern by a photofabrication method, a circuit base material 156 illustrated in FIG. 3A(1) is acquired.

Mask holes 154a, 154b and 154c are formed on the copper foil 152 on the top surface of this circuit base material 156. Also, an internal layer circuit pattern 155 including a mask hole 154d is formed on the copper foil 153 on the back surface of the circuit base material 156.

(2) Next, there is prepared a coverlay 159 in which an adhesive layer 158 (having a thickness of 15 μm)) formed of an acrylic or epoxy adhesive is formed on a polyimide film 157 having a thickness of 12 μm. Subsequently, for example, using a vacuum press or vacuum laminator, the coverlay 159 is attached to the back surface of the circuit base material 156.

Through the above process, a coverlay-attached circuit base material 160 illustrated in FIG. 3A(2) is acquired.

(3) Next, a circuit base material 166 is acquired by performing the same process as in above process (1) using another double-sided copper-clad laminate having copper foils 162 and 163 on the both surfaces of a flexible insulating base member 161. As illustrated in FIG. 3A(3), the copper foil 162 on the top surface of the circuit base material 166 forms an internal layer circuit pattern 164, and a mask hole 165 is formed on the copper foil 163 on the back surface.

(4) Next, an adhesive layer 167, which is acquired by cutting an adhesive film in accordance with the shape of the circuit base material 166, and the circuit base material 166 are aligned.

(5) Next, as illustrated in FIG. 3A(4), using a vacuum press, the circuit base material 166 and the coverlay-attached circuit base material 160 are laminated and bonded through the intermediary of the adhesive layer 167.

Through the above process, a multilayer circuit base material 168 illustrated in FIG. 3A(4) is acquired.

(6) Next, as illustrated in FIG. 3B(5), conformal laser processing is performed using a carbon dioxide laser (wavelength: about 9.8 μm). In this way, simple via holes 169 and 170, a skip via hole 171 and a step via hole 172 are formed. At the time of this laser processing, the mask holes 154a, 154b, 154c, 154d and 165 function as a conformal mask.

Through the above process, a multilayer circuit base material 173 illustrated in FIG. 3B(5) is acquired.

(7) As illustrated in FIG. 3B(6), a plated layer of about 20 μm is formed by applying electrolytic plating processing to the whole surface of the multilayer circuit base material 173, and, after that, a conductive film of a buildup layer is processed by the photofabrication method to form external layer circuit patterns 178A and 178B.

By forming a plated layer on the internal walls of the simple via holes 169 and 170, simple vias 174 and 175 are formed. By forming a plated layer on the internal wall of the skip via hole 171, a skip via 176 is formed. By forming a plated layer on the internal wall of the step via hole 172, a step via 177 is formed.

After that, although it is not illustrated, if necessary, the top surface of a land part or the like is subjected to surface processing such as solder plating, nickel plating and gold plating, and, in a part for which the solder plating is not necessary, a protective photo solder resist layer is formed. After that, outline processing is performed by punching and the like through the use of metallic mold.

Through the above process, a multilayer flexible wiring board 179 illustrated in FIG. 3B(6) is acquired.

Next, an explanation will be given to a problem caused at the time the skip via hole 171 and the step via hole 172 are formed by laser processing.

Processed layers at the time of forming the skip via hole 171 and the step via hole 172 are the flexible insulating base member 151, the adhesive layer 158, the polyimide film 157 and the adhesive layer 167 in this order from the laser radiation surface side.

The flexible insulating base member 151 and the adhesive layer 158 are different in the decomposition temperature and the absorbance in a wavelength of around 10 μm which is a waveband of a carbon dioxide laser. That is, the flexible insulating base member 151 has a higher decomposition temperature than that of the adhesive layer 158, while the adhesive layer 158 has a higher absorbance in the waveband of the carbon dioxide laser than that of the flexible insulating base member 151.

In other words, compared to the flexible insulating base member 151, the adhesive layer 158 arranged below the flexible insulating base member 151 has a lower decomposition temperature and a higher absorbance in the waveband of the carbon dioxide laser.

Therefore, by laser light thorough the flexible insulating base member 151, ablation occurs in the adhesive layer 158 earlier than the flexible insulating base member 151. In this way, as illustrated in FIG. 4(a), a gas caused by the ablation of the adhesive layer 158 deforms the flexible insulating base member 151 and causes a bulge part 180. After that, when the pulsed laser is further radiated, as illustrated in FIG. 4(b), the bulge part 180 bursts and a burr part 181 is caused.

When the burr part 181 occurs, processed layers below it (e.g. the flexible insulating base member 151 and the adhesive layer 158) are prevented from being subjected to laser processing. Therefore, a resin residue is likely to occur on the internal layer circuit patterns 155 and 164 exposed into the skip via hole 171 and the step via hole 172.

Especially, in the case of forming a step via hole, as illustrated in FIG. 4(b), due to the step configuration, part of the burr part 181 is likely to be placed on a copper foil of an external layer. In such a case, subsequent laser processing is largely blocked.

Such a resin residue is not removed even in a desmear process performed after a laser processing process. As a result, plating adhesion to the internal walls of the step via hole and skip via hole degrades, which is a cause of degrading the reliability of an interlayer conduction path.

Also, the same applies to the polyimide film 157 and the adhesive layer 167. That is, by pulsed light passing the polyimide film 157, the adhesive layer 167 having a lower decomposition temperature and higher absorbance than the polyimide film 157 is subjected to ablation earlier.

To remove the above resin residue, it is necessary to further radiate pulsed laser. However, when the number of shots of pulsed laser is increased, there arises a problem that the productivity decreases.

Also, when the number of shots is excessively increased, the heat is accumulated in the adhesive layers 158 and 167, and, as a result, as seen from FIG. 3B(5), the adhesive layers 158 and 167 largely pull back in the side walls of the skip via hole 171 and the step via hole 172, which increases the asperities of the side walls. As a result, as seen from FIG. 3B(6), discontinuous parts occur in plate layers formed on the side walls, which is a cause of degrading the reliability.

While it is thus necessary to remove a resin residue, it is required to form a via hole in as few shots as possible in order to improve the productivity and maintain the via reliability.

Therefore, to reduce the number of shots required for processing, it is considered to increase the energy density per shot of pulsed laser. However, in a case where the copper foil 162 forming the internal layer circuit pattern 164 is thin (for example, equal to or below 12 the pulsed light penetrates the copper foil, which is a cause of an occurrence of short defect. In recent years, to form a fine wiring pattern, there are many cases where a copper foil has to be made thin.

Also, in the case of forming the step via hole 172, even after the flexible insulating base member 151 is removed and the internal layer circuit pattern 155 is exposed, to remove the adhesive layers 158 and 167 and the polyimide film 157, pulsed light of high energy density is radiated. Therefore, in a case where the copper foil 153 forming the internal layer circuit pattern 155 has a relatively thin thickness (for example, equal to or below 12 μm), the internal layer circuit pattern 155 (i.e. copper foil 153) deforms and there occurs a space part between the internal layer circuit pattern 155 and the adhesive layer 158. This space part causes a discontinuous part in the plate layer formed on the side wall of the step via hole, which is a cause of degrading the reliability of the step via.

Also, in the case of radiating pulsed light of high energy density per shot, similar to the case of increasing the number of shots, since the heat amount accumulated in the adhesive layers 158 and 167 becomes large, the retreat amounts of the adhesive layers 158 and 167 increase and the asperity of the side wall of the via hole becomes large.

Meanwhile, there are known two laser processing methods, that is, there are known a cycle processing method of radiating pulsed light in this order on a one-shot basis to a plurality of mask holes provided in a processing area and a burst processing method of sequentially radiating pulsed light to one mask hole.

In the case of the burst processing method, by radiating a laser pulse of the second shot before the flexible insulating base member 151 bulges and turns up by pulsed light of the first shot, and by removing the flexible insulating base member 151, there is a possibility of being able to suppress an occurrence of resin residue. However, to continuously radiate pulsed light to the identical part, the heat amount accumulated in the radiated part becomes large. As a result, similar to the case of increasing the energy density per shot and the case of increasing the number of shots of pulsed light of small energy density, there occurs a case where, for example, the asperity of a via hole side wall becomes large.

In the related art, to remove a resin remaining in a via hole, there is a known laser processing method of increasing energy density of pulsed light on the way of laser processing of the via hole (Patent Literature 2). In this method, the number of processed layers is only one (resin layer 12) and therefore there does not occur a phenomenon of the above bulge and burr of the flexible insulating base member. Also, in a case where a metal layer (i.e. copper land 11) is thin, there may occur a case where pulsed light of large energy density causes the penetration and deformation of the copper land 11 exposed in the bottom surface of the via hole.

In addition, to solve the above problem, as a material of the adhesive layers 158 and 167, it is considered to use a polyamide adhesive having a lower laser light absorbance and higher decomposition temperature than an epoxy or acrylic adhesive. However, the polyamide adhesive is more expensive than the epoxy or acrylic adhesive which is generally used for a multilayer flexible printed wiring board. Therefore, there is a problem that the production cost increases.

CITATION LIST

Patent Literature

Patent Literature 1: Japanese Patent No. 2562373
Patent Literature 2: Japanese Patent Laid-Open No. 2005-28369

SUMMARY OF THE INVENTION

With the present invention, a via hole is formed in as few shots as possible, without causing a resin residue in a via hole and causing the deformation and penetration of an internal layer circuit pattern exposed into the via hole.

According to an aspect of the present invention, there is provided a laser processing method of forming a via hole having a conductive film exposed in a bottom surface, by removing processed layers formed on the conductive film forming an internal circuit pattern by a laser, the processed layers including a first insulating layer and a second insulating layer, the first insulating layer provided with a conformal mask on a top surface thereof and having a first absorbance in an operational wavelength range of a processing laser and a first decomposition temperature, and the second insulating layer provided below the first insulating layer and having a second absorbance higher than the first absorbance in the operational wavelength range and a second decomposition temperature lower than the first decomposition temperature, the method including: radiating one shot of pulsed light having a first energy density that can remove the first insulating layer of the processed layers by one shot without causing a deformation and penetration of the conductive film; and subsequently radiating pulsed light having a second energy density that is lower than the first energy density and can remove a rest of the processed layers by a predetermined number of shots without causing a deformation and penetration of the conductive film.

According to another aspect of the present invention, there is provided a production method of a multilayer flexible printed wiring board having a feature of forming a via for interlayer connection by plating an internal wall of a via hole formed by the laser processing method according to an aspect of the present invention.

With these features, the present invention provides the following effects.

Since the first insulating layer of a processed layer is completely removed by the first shot, a burr part does not occur in the first insulating layer. Therefore, it is possible to prevent an occurrence of a resin residue due to the burr part. Also, since the burr part does not occur, it is possible to reduce the total number of shots, which is required to form a via hole, as much as possible.

Further, the first and second energy densities have values not to cause the deformation and penetration of a conductive film forming an internal layer circuit pattern, there does not occur the deformation and penetration of an internal layer circuit pattern exposed into a via hole that is finally formed.

Further, as a result of suppressing a resin residue and the expansion of asperities of via hole side walls, plating adhesion to the internal wall of the via hole is improved and it is possible to form a via of high reliability.

DETAILED DESCRIPTION OF THE INVENTION

In the following, with reference to the drawings, production methods of a multilayer flexible printed wiring board according to two embodiments of the present invention will be explained. The number of processed layers is four in Embodiment 1 and two in Embodiment 2.

Embodiment 1

FIG. 1A to FIG. 1D are cross-sectional views illustrating a production method of a multilayer flexible printed wiring board according to Embodiment 1.

Figure 1A:
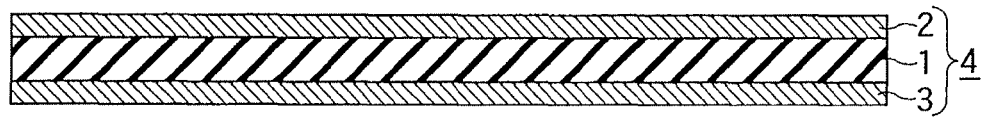
FIG. 1A is a process cross-sectional view illustrating a production method of a multilayer flexible printed wiring board according to Embodiment 1 of the present invention.
Figure 1A:
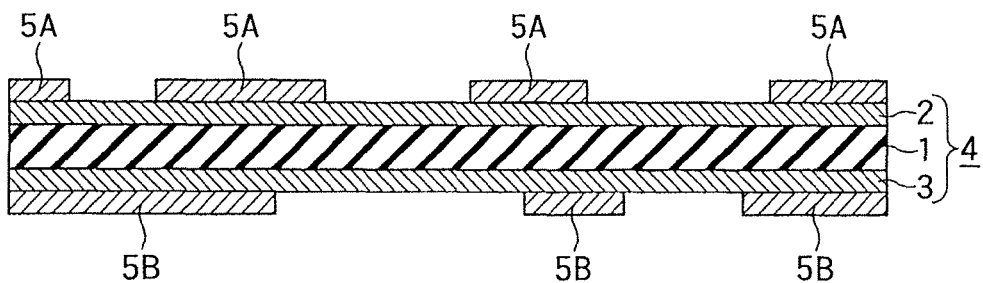
Figure 1A:
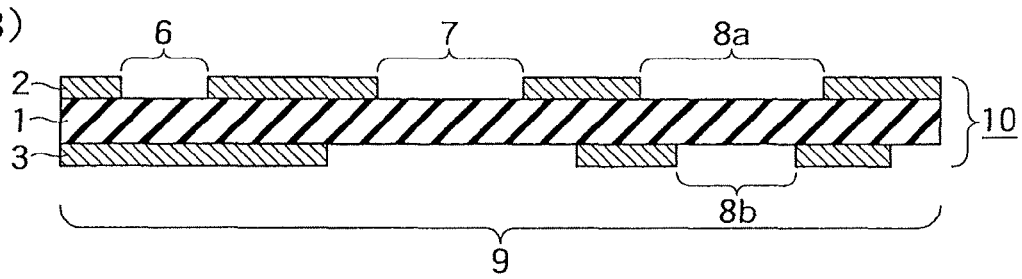
Figure 1A:
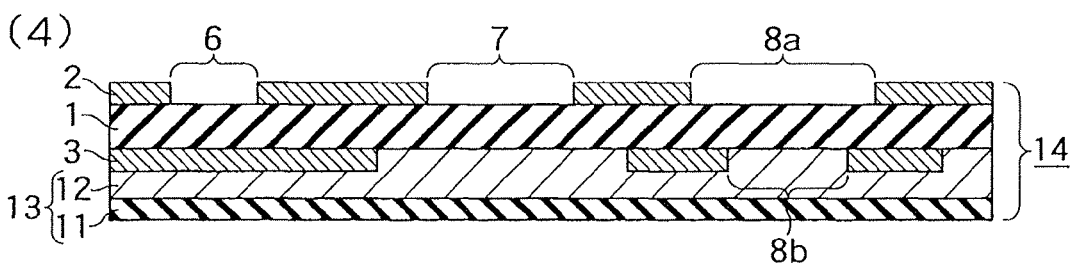

(1) First, a flexible double-sided copper-clad laminate 4 is prepared. As illustrated in FIG. 1A(1), this double-sided copper-clad laminate 4 has copper foils 2 and 3 (each having a thickness of 12 μm, for example) on the both surfaces of a flexible insulating base member (first insulating layer) 1 (polyimide film having a thickness of 25 μm, for example). Here, the flexible insulating base member 1 is not limited to a film formed of polyimide, and it is possible to use a film formed of a liquid crystal polymer.

Also, the thicknesses of the flexible insulating base member 1, the copper foil 2 and the copper foil 3 are not limited to the above values and can be adequately selected depending on the intended use. For example, in a case where a high flexibility is required, it is preferable to select a thin thickness (for example, 12.5 μm) for the flexible insulating base member 1. In a case where a fine wiring pattern is required, it is preferable to select a thin thickness (for example, 9 μm) for the copper foils 2 and 3.

(2) Next, as illustrated in FIG. 1A(2), resist layers 5A and 5B are formed on the copper foils 2 and 3 of the double-sided copper-clad laminate 4, respectively.

These resist layers 5A and 5B are provided to form an internal layer circuit pattern 9 including mask holes 6, 7, 8a and 8b, which will be described later, by a photofabrication method.

(3) Next, as illustrated in FIG. 1A(3), the copper foils 2 and 3 are etched using the resist layers 5A and 5B, and, after that, the resist layers 5A and 5B are detached. Here, in the etching process, for example, it is possible to use an etchant including copper chloride and ferric chloride.

In this way, the mask hole 6, the mask hole 7 (for example, φ150 μm) and the mask hole 8a (for example, φ200 μm) are formed on the copper foil 2 and the mask hole 8b (for example, φ150 μm) is formed on the copper foil 3. The mask holes 8a and 8b function as a conformal mask for upper-hole and lower-hole of the step via hole respectively.

Here, after the resist layers 5A and 5B are detached, roughening processing may be performed if necessary. In this way, it is possible to improve the heat-resistant adhesive between the copper foil 3 and an adhesive layer 12 of a coverlay 13, which will be described later.

Through the above process, a circuit base material 10 illustrated in FIG. 1A(3) is acquired.

(4) Next, there is prepared a coverlay 13 including an adhesive layer (second insulating layer) 12 (for example, having a thickness of 12 μm) formed of an acrylic or epoxy adhesive on a flexible insulating film (third insulating layer) 11 (for example, polyimide film having a thickness of 12 μm). Subsequently, as illustrated in FIG. 1A(4), this coverlay 13 is attached to the internal layer side (i.e. lower side in the figure) of the circuit base material 10 using a vacuum press or vacuum laminator. At this time, the internal layer circuit pattern 9 is filled with an adhesive layer 12.

Through the above process, a coverlay-attached circuit base material 14 illustrated in FIG. 1A(4) is acquired.

Also, by performing the processes in FIG. 1A(1) to FIG. 1A(4) by a role-to-role process, it is possible to further improve the productivity.

(5) Next, there is prepared a flexible double-sided copper-clad laminate having the coppers 2A and 3A (for example, each having a thickness of 12 μm) on the both surfaces of the flexible base member 1A (for example, having a thickness of 25 μm). Subsequently, this double-sided copper-clad laminate is processed in the same way as the method explained in the processes in FIG. 1A(1) to FIG. 1A(3), and a circuit base material 17 illustrated in FIG. 1B(5) is acquired. The copper foil 2A of the top surface of this circuit base material 17 forms the internal layer circuit pattern 16 and the copper foil on the back surface has the mask hole 15. Part of this internal layer circuit pattern 16 is a reception land at the time a via hole is formed by laser processing.

Figure 1B:
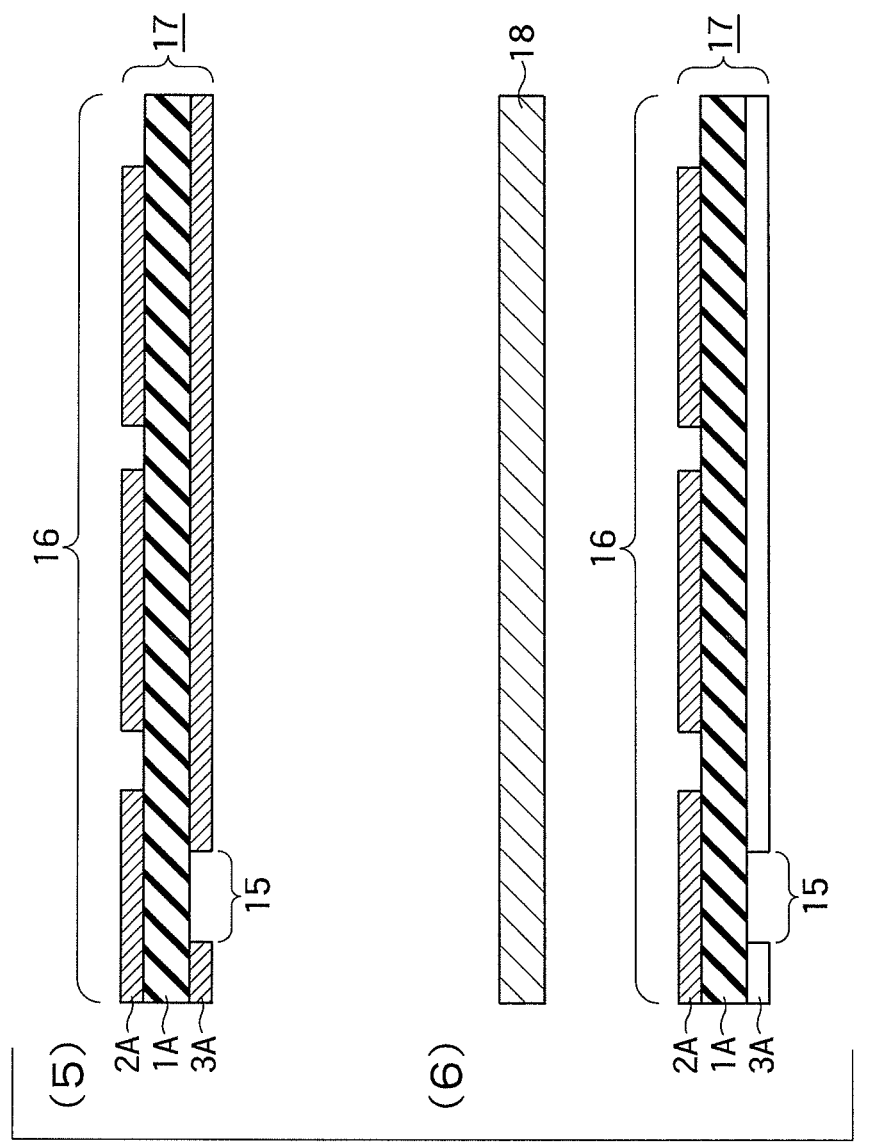
FIG. 1B is a process cross-sectional view illustrating the production method of the multilayer flexible printed wiring board according to Embodiment 1 of the present invention, which is subsequent to FIG. 1A.

(6) Next, as illustrated in FIG. 1B(6), an adhesive film (for example, having a thickness of 15 to 20 μm) is cut in accordance with the shape of the circuit base material 17, and a resulting adhesive layer (fourth insulating layer) 18 and the circuit base material 17 are aligned. Here, as an adhesive forming this adhesive layer 18, it is preferable to use prepreg of a low-flow type or a bonding sheet with less flow.

Figure 1C:
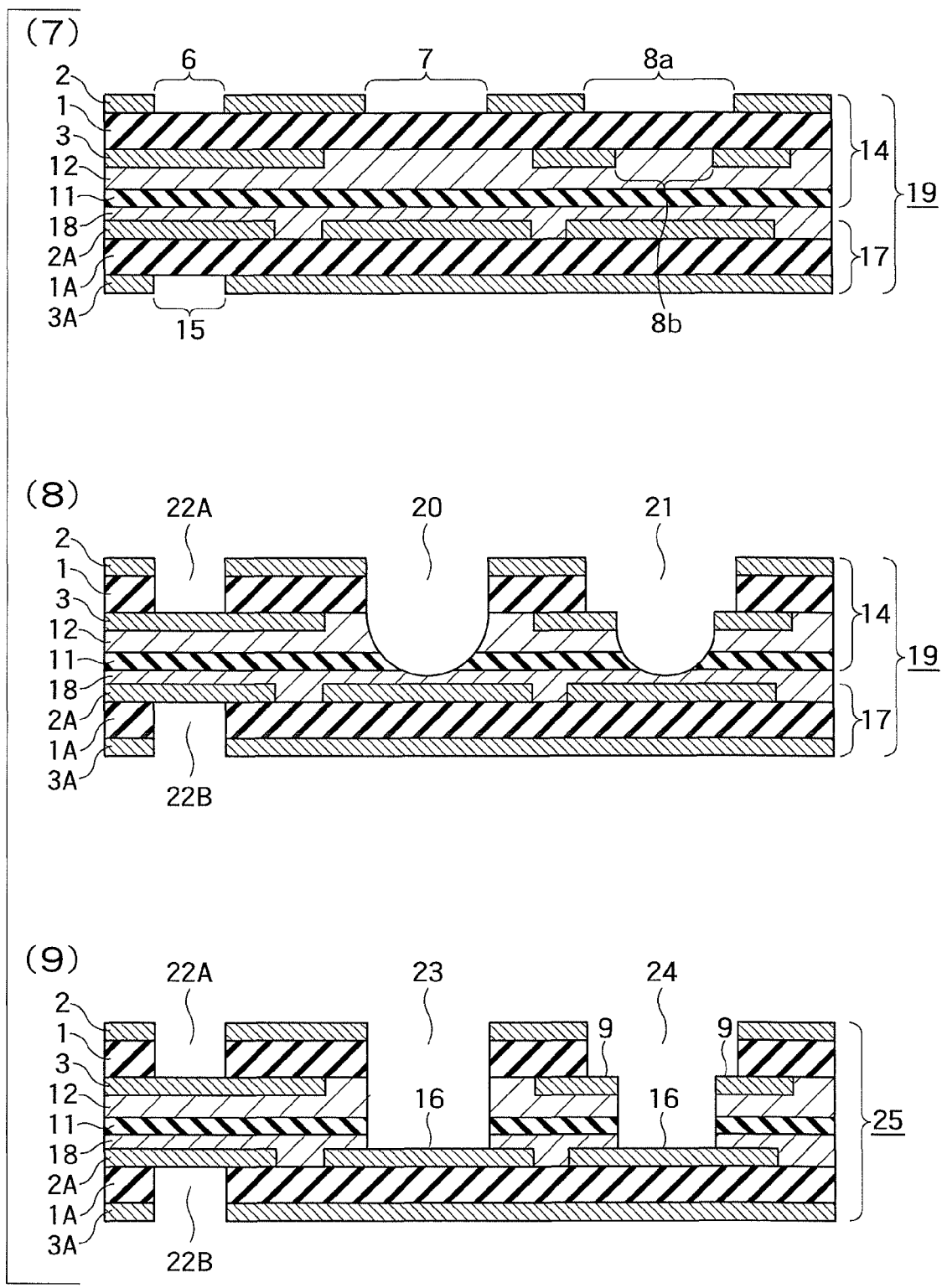
FIG. 1C is a process cross-sectional view illustrating the production method of the multilayer flexible printed wiring board according to Embodiment 1 of the present invention, which is subsequent to FIG. 1B.

(7) Next, as illustrated in FIG. 1C(7), using a vacuum press and the like, the coverlay-attached circuit base material 14 and the circuit base material 17 are laminated and bonded through the intermediary of the adhesive layer 18. In this way, the internal layer circuit pattern 16 formed of the copper foil 2A is filled with the adhesive layer 18.

Through the above process, a multilayer circuit base material 19 illustrated in FIG. 1C(7) is acquired.

(8) Next, by performing conformal laser processing using the mask holes 6, 7, 8a, 8b and 15, a via hole is formed. As the processing laser, an infrared laser is used. For example, it is preferable to use a carbon dioxide laser of high productivity.

Before explaining laser processing conditions of the present process in detail, the decomposition temperature and absorbance of the flexible insulating base member 1 and the adhesive layer 12 will be explained in detail.

Table 1 shows the 5% weight decomposition temperature and the absorbance ratio in a wavenumber of 1000 $cm^{-1}$ (i.e. wavelength of 10 μm), with respect to the flexible insulating base member 1 and the adhesive layer 12 (i.e. epoxy adhesive).

As seen from Table 1, the decomposition temperature of the adhesive layer 12 is lower than that of the flexible insulating base member 1 by about 200 degree. Meanwhile, the absorbance of the adhesive layer 12 is 2.5 times larger than that of the flexible insulating base member 1.

Therefore, the adhesive layer 12 involves ablation before the flexible insulating base member 1 is completely removed, and, as a result, a burr part which is a cause of a resin residue occurs in the flexible insulating base member 1.

TABLE 1

|  | 5% WEIGHT DECOMPOSITION TEMPERATURE | ABSORBANCE RATIO (1000 $cm^{-1}$) |
|---|---|---|
| FLEXIBLE INSULATING BASE MEMBER 1 | 520° C. | 1.0 |
| ADHESIVE LAYER 12 | 325° C. | 2.5 |

Next, the laser processing method according to the present embodiment will be explained.

First, pulsed light having a relatively high first energy density is radiated to each of the mask holes 6, 7, 8a and 15 (i.e. conformal masks) on a one-shot basis. As this first energy density, a value is selected which satisfies conditions of completely removing the flexible insulating base member 1 exposed in the mask hole by one shot and not causing the deformation and penetration of the internal layer circuit patterns 9 and 16.

As illustrated in FIG. 1C(8), by radiation of pulsed light having the first energy density, a via hole 20 that is being formed is made in a part corresponding to the mask hole 7 and a via hole 21 that is being formed is made in a part corresponding to the mask holes 8a and 8b. Also, simple via holes 22A and 22B are made in parts corresponding to the mask holes 6 and 15. Since a processed layer is only the flexible insulating base member 1 (1A), this simple via hole 22A (22B) is completely made by the first shot.

After that, by radiating pulsed light having the second energy density as a second or subsequent shot to the via holes 20 and 21 that are being formed, conformal laser processing continues. As this second energy density, a value is selected which is smaller than the first energy density and can remove the remaining processed layers (i.e. the adhesive layer 12, the flexible insulating film 11 and the adhesive layer 18) by a predetermined number of shots without causing the deformation and penetration of the internal layer circuit patterns 9 and 16 (i.e. the copper foils 3 and 2A) and complete the formation of via holes.

Through the above process, a multilayer circuit base material 25 illustrated in FIG. 1C(9) is acquired.

(9) Next, desmear processing and conducting processing for interlayer connection are performed on the multilayer circuit base material 25.

Figure 1D:
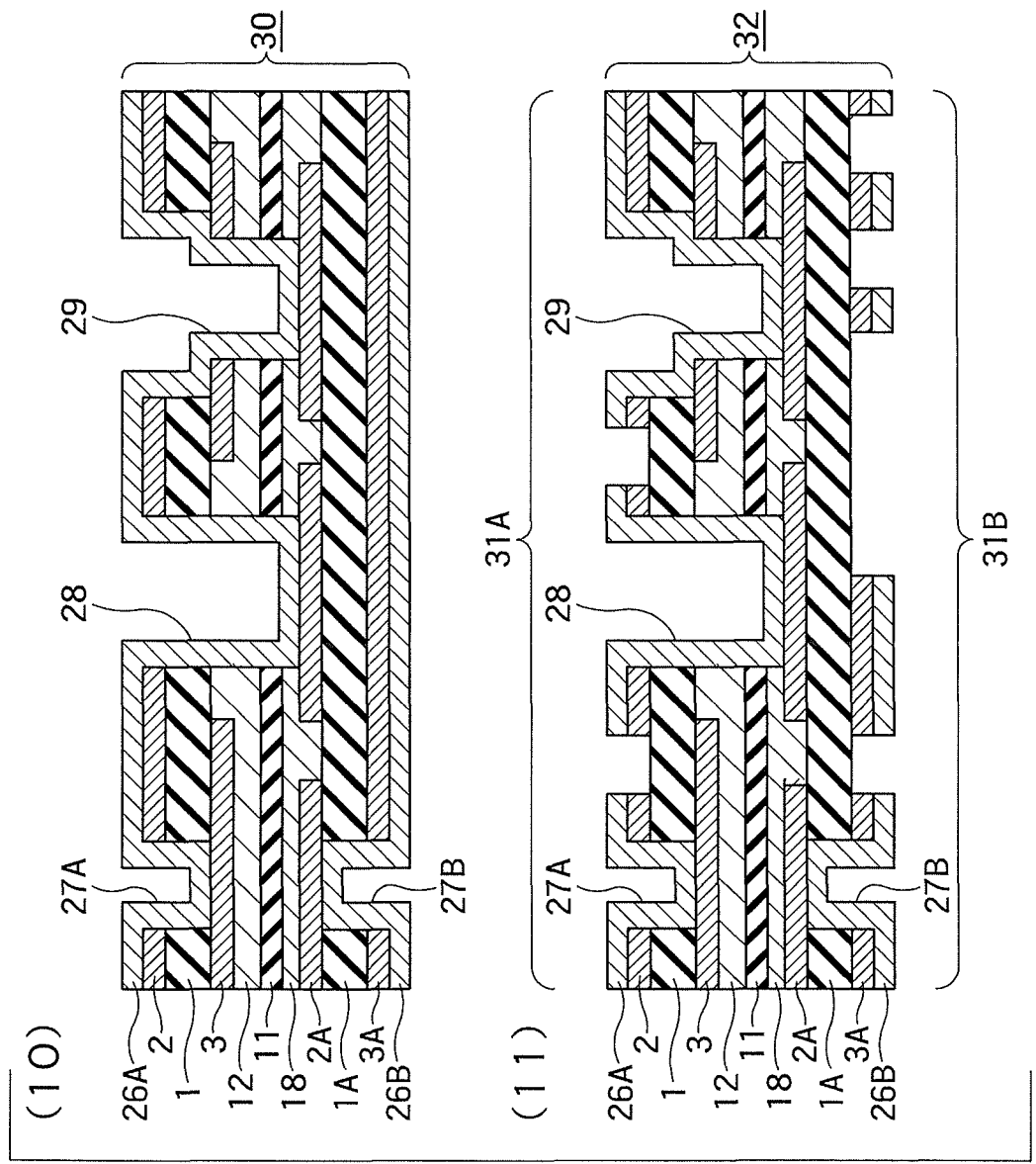
FIG. 1D is a process cross-sectional view illustrating the production method of the multilayer flexible printed wiring board according to Embodiment 1 of the present invention, which is subsequent to FIG. 1C.

(10) Next, as illustrated in FIG. 1D(10), by applying electrolytic plating processing to the whole front and back surfaces of the multilayer circuit base material 25, electrolytic plate layers 26A and 26B (each having a thickness of 15 to 20 μm) are formed. By this plating processing, the simple vias 27A and 27B, the skip via 28 and the step via 29, which function as an interlayer conduction path, are collectively formed.

Through the above process, a multilayer circuit base material 30 having interlayer conduction paths is acquired.

Also, for a part inserted and mounted in a multilayer flexible printed wiring board (e.g. IMT part) and the like, when a plated through-hole is required, before performing the plating processing in the present process, a through-hole may be formed in a predetermined part by NC drill or the like. In this way, it is possible to form the plated through-hole in the present process.

(11) Next, as illustrated in FIG. 1D(11), external-layer conducting layers (i.e. the copper foil 2+the electrolytic plate layer 26A and the copper foil 3A+the electrolytic plate layer 26B) are processed into a predetermined pattern by the photo-fabrication method. In this way, external layer circuit patterns 31A and 31B are formed on the front and back surfaces of the multilayer circuit base material 30, respectively.

After that, although it is not illustrated, if necessary, a protective photo solder resist layer is formed in a part for which the solder plating is not necessary, and the top surface of a land part or the like is subjected to surface processing such as solder plating, nickel plating and gold plating. After that, outline processing is performed by punching and the like through the use of metallic mold.

Through the above process, a multilayer flexible printed wiring board 32 according to the present embodiment illustrated in FIG. 1D(11) is acquired.

The simple via 27A performs interlayer connection between the external layer circuit pattern 31A and the internal layer circuit pattern 9, and the simple via 27B performs interlayer connection between the external layer circuit pattern 31B and the internal layer circuit pattern 16. The skip via 28 skips the internal layer circuit pattern 9 and performs interlayer connection between the external layer circuit pattern 31A and the internal layer circuit pattern 16. The step via 29 performs interlayer connection between the external layer circuit pattern 31A, the internal layer circuit pattern 9 and the internal layer circuit pattern 16.

EXAMPLE

Next, a result of actually investigating a relationship between the energy density of pulsed light of processing laser and a processing state of a via hole (i.e. step via hole 24) will be explained.

A configuration of the above multilayer circuit base material 19 (see FIG. 1C(7)) used in the present example is as follows.

Flexible insulating base member 1: Polyimide film having a thickness of 25 μm
  Thickness of copper foils 2, 3, 2A and 3A: 12 μm
  Flexible insulating film 11: Polyimide film having a thickness of 12 μm
  Adhesive layers 12 and 18: Epoxy adhesive having a thickness of 15 μm
  Diameter of mask hole 8a: 200 μm
  Diameter of mask hole 8b: 150 μm
  As a laser processing machine, ML605GTX (carbon dioxide laser) manufactured by in Mitsubishi Electric Corporation is used. The laser pulse with is fixed to 10 μsec and the laser beam radius is fixed to ϕ300 μm. Table 2 shows combinations (ID: 1 to 18) of the values of the first energy density and the second energy density, and evaluation results. Here, in Table 2, for ease of explanation, the energy density values are converted into energy values and expressed. The energy density value of pulsed light is calculated by dividing the energy value by a laser beam area.

TABLE 2

|  | PULSE LIGHT HAVING FIRST ENERGY (mJ) | PULSE LIGHT HAVING SECOND ENERGY (mJ) | ENERGY RATIO | DECISION |
|---|---|---|---|---|
| 1 | 10 | 8 | 4/5 | Δ |
| 2 | 10 | 10 | 1/1 | X |
| 3 | 12 | 2 | 1/6 | Δ |
| 4 | 12 | 4 | 1/3 | ○ |
| 5 | 12 | 6 | 1/2 | ○ |
| 6 | 12 | 8 | 2/3 | ○ |
| 7 | 12 | 10 | 5/6 | X |
| 8 | 14 | 2 | 1/7 | Δ |
| 9 | 14 | 4 | 2/7 | ○ |
| 10 | 14 | 6 | 3/7 | ○ |
| 11 | 14 | 8 | 4/7 | ○ |
| 12 | 14 | 10 | 5/7 | X |
| 13 | 16 | 2 | 1/8 | Δ |
| 14 | 16 | 4 | 1/4 | ○ |
| 15 | 16 | 6 | 3/8 | ○ |
| 16 | 16 | 8 | 1/2 | ○ |
| 17 | 16 | 10 | 5/8 | X |
| 18 | 18 | 4 | 2/9 | X |

Processing of a via hole is performed by radiating three to five shots of pulsed light having the second energy density after radiating one shot of pulsed light having the first energy density. Regarding 18 kinds (ID=1 to 18) of energy density conditions shown in Table 2, three patterns, that is, three shots, four shots and five shots of pulsed light having the second energy density are implemented. This is because, as a processing condition at the time of manufacturing a product, in the case of using four shots, it is decided whether to include a processing margin of ±1 shot.

The processing state of the via hole is evaluated using three criteria ("○", "Δ", "x"). The criterion "○" shows a decision that a resin residue and the deformation and penetration of copper foil are not caused and adequate processing is possible in three, four and five shots of pulsed light having the second energy density. The criterion "Δ" shows that a resin residue occurs in the case of at least one of those shot counts. The criterion "x" shows that the deformation or penetration of the copper foil (i.e. internal layer circuit pattern) occurs in the case of at least one of those shot counts.

Here, the process of deriving a suitable range of the first energy density and the second energy density will be explained.

First, when checking a processing state after radiating one shot of pulsed light having the first energy of 10 mJ (energy density: 141 mJ/mm$^2$), the flexible insulating base member 1 is not completely removed and a burr of the flexible insulating base member 1 is found. After that, when radiating pulsed light having the second energy of 8 mJ (energy density: 113 mJ/mm$^2$), a resin residue is found (ID 1). The resin residue occurs regardless of selecting a relatively large value as the second energy because it is considered that laser processing is blocked due to a burr of the flexible insulating base member 1.

Next, to remove a resin residue, a value is further selected as the second energy and laser processing is performed. That is, when radiating pulsed light having the second energy of 10 mJ after radiating one shot of pulsed light having the first energy of 10 mJ, the deformation of the copper foil is found (ID 2).

From the above result, it is decided that the first energy equal to or below 10 mJ is not adequate because the flexible insulating base member 1 cannot be removed by one shot.

Next, when radiating one shot of pulsed light having the first energy of 18 mJ (energy density: 255 mJ/mm$^2$), the deformation of the copper foil is found (ID 18).

Therefore, it is found that it is necessary to select a value above 10 mJ and below 18 mJ as the first energy.

Therefore, a processing state of the via hole is checked when radiating pulsed light having the first energies of 12, 14 and 16 mJ (energy densities: 170, 198 and 226 mJ/mm$^2$).

As a result, although the bulge and burr of the flexible insulating base member 1 are not found, it is found that the eventual via hole processing state varies depending on a selected second energy value.

First, when radiating pulsed light having the second energy of 2 mJ (energy density: 28 mJ/mm$^2$), a resin residue is found (ID's 3, 8 and 13) in the case of any first energy.

Next, in the case of radiating pulsed light having the second energy of 10 mJ, the deformation of the copper foil is found (ID's 7, 12 and 17) in the case of any first energy.

Therefore, when radiating pulsed light having the second energies of 4, 6 and 8 mJ (energy densities: 57, 85 and 113 mJ/mm$^2$), it is found that there is no deformation and penetration of the resin residue and copper foil and suitable processing is possible (ID's 4 to 6, 9 to 11 and 14 to 16).

From the above result, it is found that, by selecting 12 mJ to 16 mJ (energy densities: 170 to 226 mJ/mm$^2$) as the first energy and 4 mJ to 8 mJ (energy densities: 57 to 113 mJ/mm$^2$) as the second energy, suitable laser processing is possible by total shot counts of 4 to 6.

Table 2 shows a ratio (i.e. energy ratio) of the second energy to the first energy. From the above result, the second energy density with respect to the first energy density (i.e. energy ratio) is suitably set to ¼ to ⅔ depending on the first energy density.

Meanwhile, in the present example, in a case where pulsed light having the first energy density is relatively small, after the first shot, although the flexible insulating base member 1 is completely removed, there is a case where a penetration hole is not formed on the flexible insulating film 11. However, a resin residue due to a burr of the flexible insulating film 11 does not occur. This may be because the flexible insulating film 11 is positioned in the deeper internal side of the via hole than the flexible insulating base member 1. That is, this may be because, even in a case where ablation occurs earlier in the adhesive layer 18 immediately below the flexible insulating film 11, since there is a side wall of the via hole in the vicinity of the flexible insulating film 11, a burr part is less likely to occur in the flexible insulating film 11.

In view of this, even in the case of a via hole formed by removing four or more processed layers, by increasing the number of shots of pulsed light having the second energy density, it is possible to apply the processing conditions in Table 2.

Figure 1E:
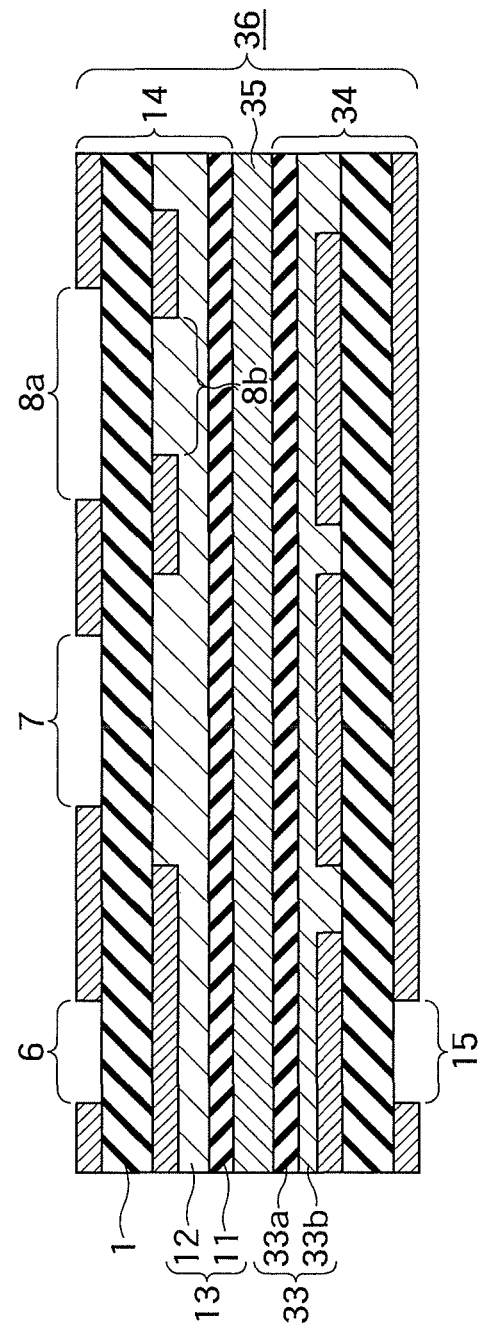
FIG. 1E is a cross-sectional view illustrating a multilayer circuit base member having six processed layers.

As such an example, FIG. 1E illustrates a multilayer circuit base material 36 having six processed layers (three pairs of two kinds of insulating layers of different workability). This multilayer circuit base material 36 is formed by bonding a coverlay-attached circuit base material 34 having a coverlay 33 and the coverlay-attached circuit base material 14 having the coverlay 13 through the intermediary of an adhesive layer 35 such that the coverlays 13 and 33 face to each other.

Here, the coverlay-attached circuit base material 34 is acquired by attaching the coverlay 33, which is formed of a flexible insulating film 33a and an adhesive layer 33b, to the above circuit base material 17.

In the case of forming a via hole by performing conformal laser processing on this multilayer circuit base material 36, there is a low possibility that a burr part occurs in the flexible insulating film 33a of the coverlay 33. Therefore, by radiating pulsed light having the first energy density, it is not necessary to form a penetration hole on the flexible insulating films 11 and 33a, and it is possible to use the energy density conditions in Table 2.

The example of Embodiment 1 has been described above.

As described above, according to the present embodiment, to form via holes by removing four insulating layers of different workability, first, one shot of pulsed light having the first energy density is radiated to form the via holes (20, 21) in a halfway manner. As this first energy density, a value is selected which does not cause the penetration and deformation of the copper foils 3 and 3A forming the internal layer circuit patterns 9 and 16 and can completely remove the flexible insulating base member 1 exposed in the mask holes 7 and 8a by one shot. In this way, it is possible to prevent a burr part from being caused in the flexible insulating base member 1 and prevent a resin residue due to the burr part from being caused.

Regarding the second or subsequent shot, pulsed light having the second energy density is radiated to complete the via holes (20, 21). As this second energy density, a value is selected which is smaller than the first energy density and can remove the remaining processed layers by a predetermined number of shots (for example, 4 shots) without causing the penetration and deformation of the copper foils 3 and 2A forming the internal layer circuit patterns 9 and 16 and complete the formation of the via holes.

According to the method of the present embodiment, it is possible to form the via holes (23, 24) without causing a resin residue due to a burr of the flexible insulating base member 1 and causing the deformation and penetration of the copper foils 3 and 2A forming the internal layer circuit patterns.

Further, expansion of the asperities of the side walls of the via holes (23, 24) formed as above is suppressed as much as possible. This is because, since a burr part to block laser processing does not occur, it is possible to significantly reduce the total number of shots required to form the via holes and therefore a heat amount accumulated in the laser irradiated part is small.

As a result of suppressing a resin residue and the asperities of the side walls, plating adhesion to the internal walls of the via holes is improved and it is possible to improve the reliability of the skip via 28 and the step via 29 functioning as an interlayer connection path.

Further, according to the present embodiment, since a general and relatively cheap material is used for a processed layer, it is possible to produce a multilayer flexible printed wiring board at a low cost.

Embodiment 2

Next, a production method of a multilayer flexible printed wiring board according to Embodiment 2 will be explained. One of differences between the present embodiment and Embodiment 1 is the number of processed layers at the time of forming a via hole. While the number of processed layers is four (i.e. the flexible insulating base member 1, the adhesive layer 12, the flexible insulating film 11 and the adhesive layer 18) in Embodiment 1, while the number of processed layers is two in the present embodiment.

Figure 2A:
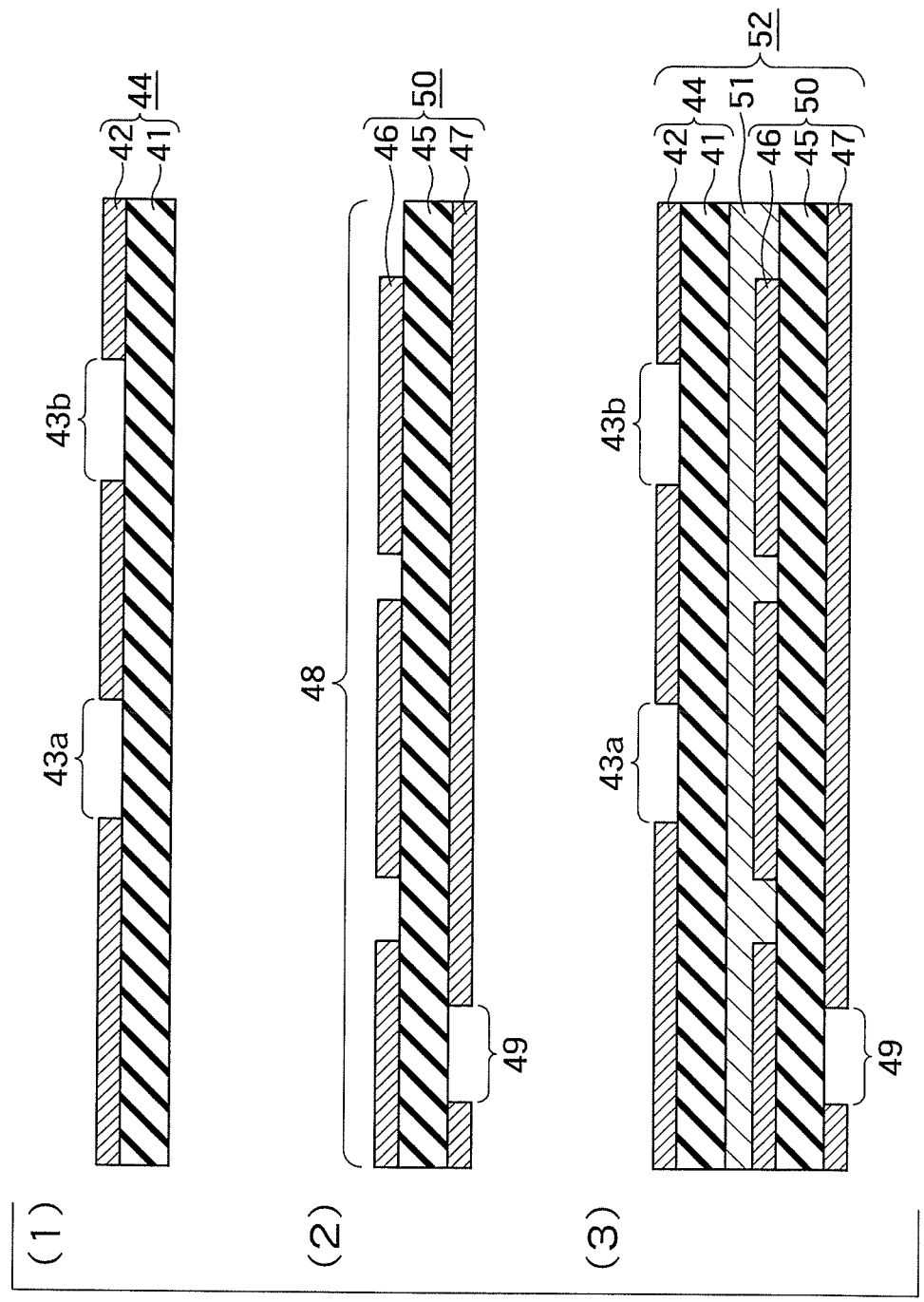
FIG. 2A is a process cross-sectional view illustrating a production method of a multilayer flexible printed wiring board according to Embodiment 2 of the present invention.
Figure 2B:
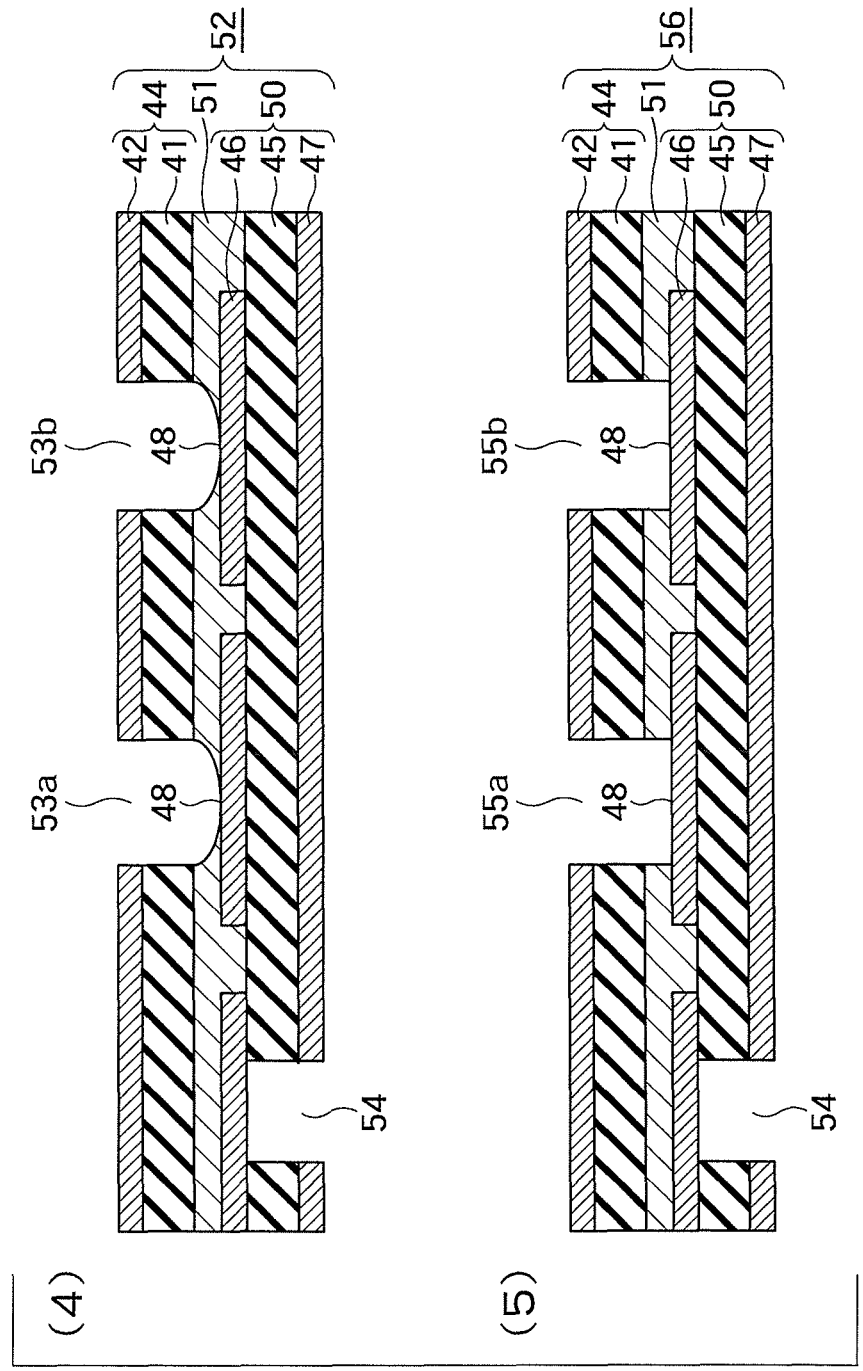
FIG. 2B is a process cross-sectional view illustrating the production method of the multilayer flexible printed wiring board according to Embodiment 2 of the present invention, which is subsequent to FIG. 2A.
Figure 3A:
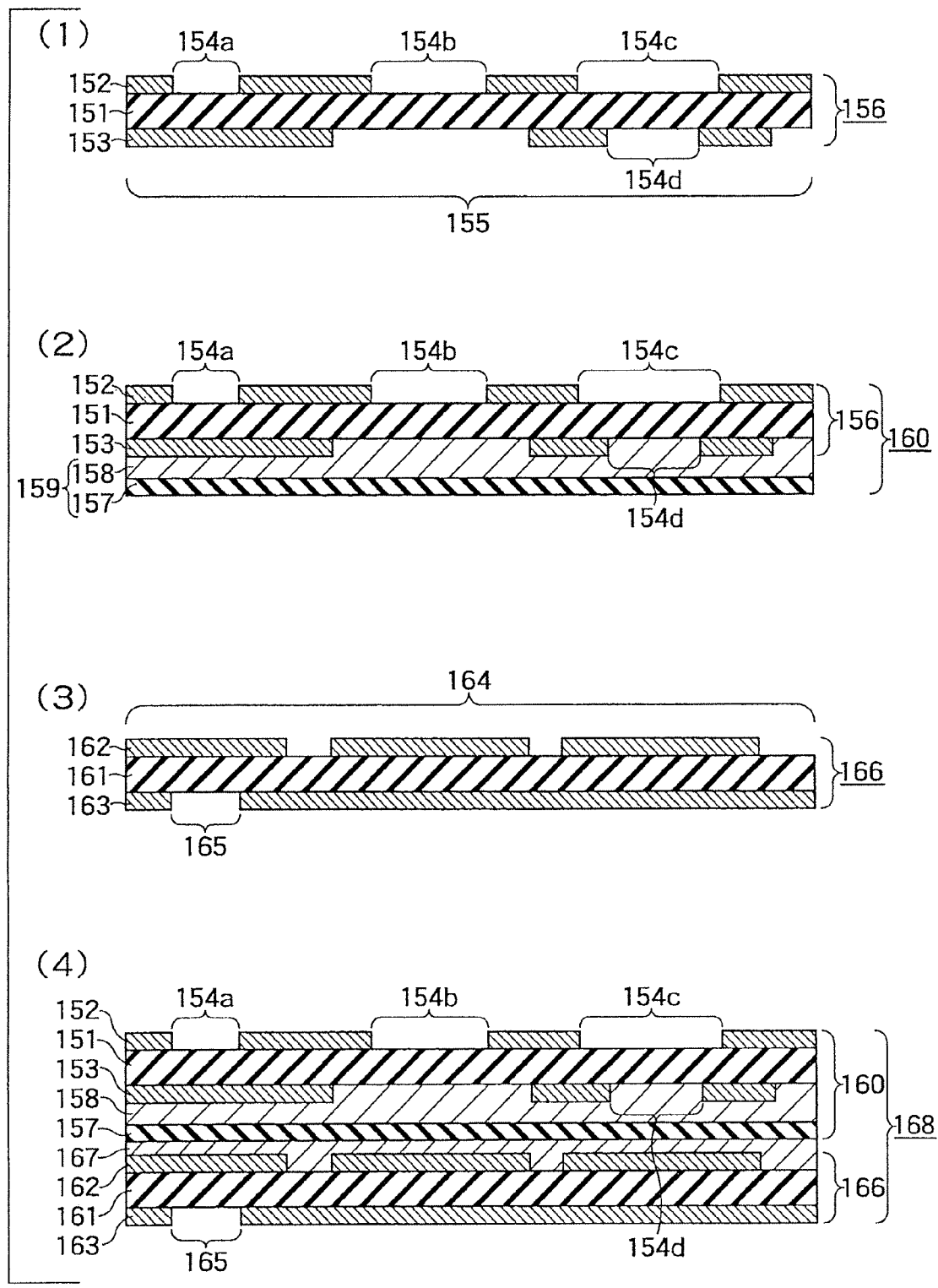
FIG. 3A is a process cross-sectional view illustrating a production method of a multilayer flexible printed wiring board according to the related art.
Figure 3B:
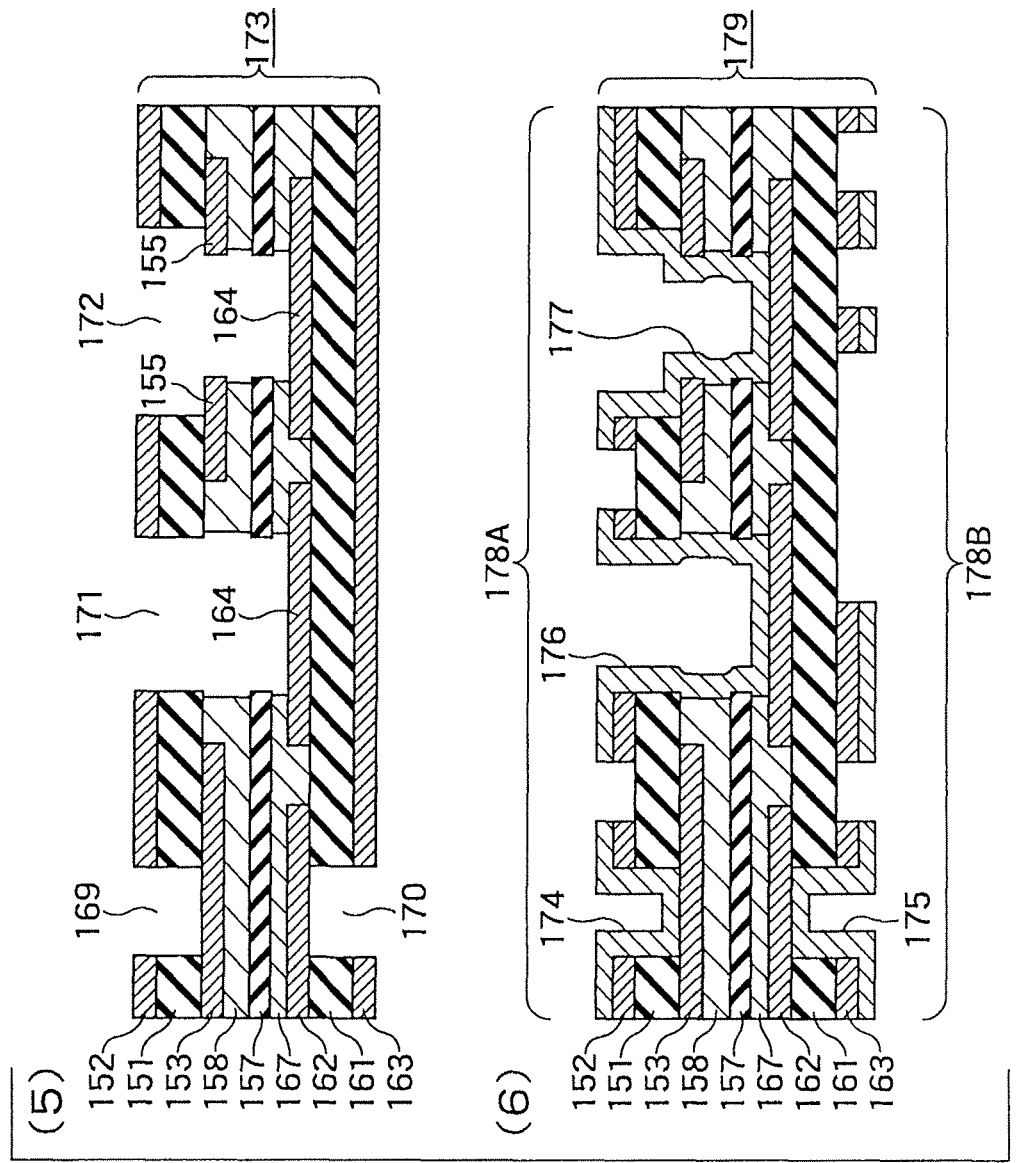
FIG. 3B is a process cross-sectional view illustrating the production method of the multilayer flexible printed wiring board according to the related art, which is subsequent to FIG. 3A.
Figure 4:
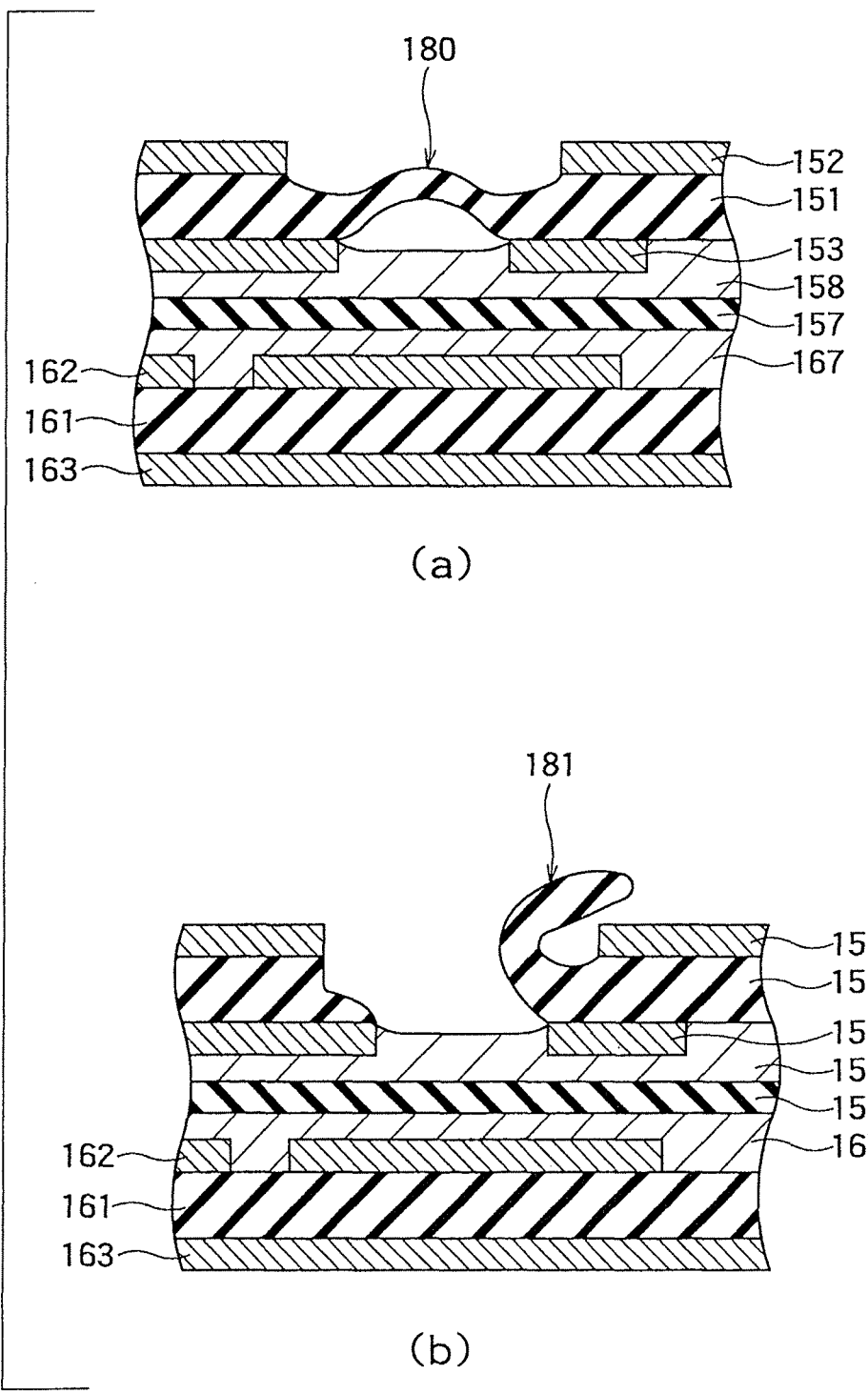
FIG. 4 is a view for explaining a problem that occurs at the time a via hole is formed in the related art.

FIG. 2A and FIG. 2B are process cross-sectional views illustrating the production method of the multilayer flexible printed wiring board according to Embodiment 2.

(1) First, there is prepared a flexible one-surface copper-clad laminate having a copper foil 42 (for example, having a thickness of 12 μm) on one surface of a flexible insulating base material (first insulating layer) 41 (for example, polyimide film having a thickness of 25 μm). The flexible insulating base material 41 is not limited to the polyimide film and it is possible to use a liquid crystal polymer film.

(2) Subsequently, similar to the method explained in Embodiment 1, a copper foil 42 is processed in a predetermined pattern and a circuit base material 44 illustrated in FIG. 2A(1) is acquired. In the copper foil 42 of this circuit base material 44, mask holes 43*a* and 43*b* functioning as a conformal mask at the time of laser processing are formed.

(3) Next, there is prepared a flexible double-sided copper-clad laminate having copper foils 46 and 47 (for example, each having a thickness of 12 μm) on the both surfaces of the flexible insulating base material 45 (for example, polyimide having a thickness of 25 μm).

Subsequently, similar to the method explained in Embodiment 1, the copper foils 46 and 47 are processed in a predetermined pattern to acquire a circuit base material 50 illustrated in FIG. 2A(2). A copper foil 46 on the top surface of this circuit base material 50 is processed in an internal layer circuit pattern 48. Meanwhile, in a copper foil 47 on the back surface, a mask hole 49 functioning as a conformal mask at the time of laser processing is formed.

(4) Next, the circuit base material 44 and the circuit base material 50 are laminated and bonded through the intermediary of an adhesive layer (second insulating layer) 51 by vacuum press or the like to acquire a multilayer base material 52 illustrated in FIG. 2A(3). In this way, the internal layer circuit pattern 48 formed of the copper foil 46 is filled with the adhesive layer 51.

(5) Next, by performing conformal laser processing using the mask holes 43*a*, 43*b* and 49 formed on the copper foils, via holes are formed. In the laser processing of the present process, an infrared laser is used. For example, it is preferable to use a carbon dioxide laser of high productivity. The laser processing of the present process includes two processes ((5-1) and (5-2)).

(5-1) First, by radiating pulsed light having the first energy density to each of the mask holes 43*a*, 43*b* and 49 on a one-shot basis, the flexible insulating base materials 41 and 45 exposed in the mask holes are completely removed. In this way, as illustrated in FIG. 2B(4), via holes 53*a* and 53*b* that are being formed, which correspond to the mask holes 43*a* and 43*b*, and a simple via hole 54 corresponding to the mask hole 49 are made. By this first shot, the via hole 54*b* is completely formed.

As the first energy density, a value is selected which satisfies conditions of completely removing the flexible insulating base members 41 and 45 exposed in the mask holes by one shot and not causing the deformation and penetration of the copper foil 46 (i.e. internal layer circuit pattern 48).

(5-2) Next, by radiating pulsed light having the second energy density as a second or subsequent shot to the via holes 53*a* and 53*b* that are being formed, conformal laser processing continues. As this second energy density, a value is selected which is smaller than the first energy density and can complete the formation of via holes by a predetermined number of shots without causing the deformation and penetration of the internal layer circuit pattern 48 (i.e. copper foil 46).

Through the above process, a multilayer circuit base material 56 illustrated in FIG. 2B(5) is acquired. Subsequent processes (i.e. formation of a plate layer onto the internal wall of a via hole and formation of an external layer circuit pattern) are similar to Embodiment 1 and therefore explanation thereof will be omitted.

By the above laser processing, as illustrated in FIG. 2B(5), it is possible to form the via holes 55*a* and 55*b* without resin residues inside, without the deformation and penetration of the internal layer circuit pattern 48 (i.e. copper foil 46) exposed in the inside. Further, similar to Embodiment 1, it is possible to suppress asperities of via hole side walls as much as possible.

Thus, even in a case where the number of processed layers is two (i.e. the flexible insulating base member 41 and the adhesive layer 51), it is possible to acquire the same effect as in Embodiment 1.

Based on the above description, although those skilled in the art may conceive an additional effect or various variations of the present invention, aspects of the present invention are not limited to the above embodiments. Various additions and changes and partial deletion are possible without departing from the conceptual idea and scope of the present invention derived from content defined in the claims and its equivalence.

REFERENCE SIGNS LIST 1, 1A, 41, 45, 151, 161 Flexible insulating base member
2, 2A, 3, 3A, 42, 46, 47, 152, 153, 162, 163 Copper foil
4 Double-sided copper-clad laminate
5A, 5B Resist layer
6, 7, 8*a*, 8*b*, 15, 43*a*, 43*b*, 49, 154*a*, 154*b*, 154*c*, 154*d*, 165 Mask hole
9, 16, 48, 155, 164 Internal layer circuit pattern
10, 17, 44, 50, 156, 166 Circuit base member
11, 33*a* Flexible insulating film
12, 18, 33*b*, 35, 51, 158, 167 Adhesive layer
13, 33, 159 Coverlay
14, 34, 160 Coverlay-attached circuit base material
19, 25, 30, 36, 52, 56, 168, 173 Multilayer circuit base material
20, 21, 53*a*, 53*b* via hole being formed
22A, 22B, 54, 55, 169, 170 Simple via hole
23, 161 Skip via hole
24, 172 Step via hole
26A, 26B Electrolytic plate layer
27A, 27B, 174, 175 Simple via
28, 176 Skip via
29, 177 Step via
31A, 31B, 178A, 178B External layer circuit pattern
32, 179 Multilayer flexible printed wiring board
157 Polyimide
180 Bulge part
181 Burr part

The invention claimed is:

1. A laser processing method of forming a via hole in a structure that includes a first insulating layer, a second insulating layer, and a conductive film, wherein
the conductive film defines a bottom of the via hole,
the first insulating layer is provided with a first conformal mask on a top surface thereof and is characterized by a first absorbance at an operational wavelength of a pulsed laser and by a first decomposition temperature, wherein the value of the operational wavelength is one selected from one or more wavelength values that allow for functional operation of the pulsed laser, and the second insulating layer is provided below the first insulating layer and is characterized by a second absorbance that is higher than the first absorbance at the operational wavelength and by a second decomposition temperature that is lower than the first decomposition temperature, the method comprising:

a first irradiation step of radiating one shot of a first light from the pulsed laser onto the structure to completely remove a portion of the first insulating layer that is exposed by a mask hole of the first conformal mask, a first energy density of the first light being selected so that the conductive film is not deformed or penetrated by the one shot of the first light; and a second irradiating step of radiating a predetermined number of shots of a second light from the pulsed laser onto the structure to remove a portion of the second insulating layer that is below the completely removed portion of the first insulating layer so as to form the via hole, the second light having a second energy density that is lower than the first energy density and the second energy density being selected so that the conductive film is not deformed or penetrated by the predetermined number of shots of the second light.

2. The laser processing method according to claim 1, wherein the structure further includes a third insulating layer and a fourth insulating layer, the third insulating layer is provided below the second insulating layer and is characterized by a third absorbance at the operational wavelength and by a third decomposition temperature, the fourth insulating layer is provided below the third insulating layer and on the conductive film and is characterized by a fourth absorbance that is higher than the third absorbance at the operational wavelength and by a fourth decomposition temperature that is lower than the third decomposition temperature, and the third insulating layer and the fourth insulating layer are removed by the second light having the second energy density.

3. The laser processing method according to claim 2, wherein the via hole is a step via hole that is constituted by an upper hole and a lower hole and the first insulating layer is further provided with a second conformal mask on a bottom surface thereof, the second conformal mask being a patterned conductive film that is used to form the lower hole of the step via hole, and the step via hole being formed as a result of the first and second irradiation steps, wherein the value of each of the first energy density and the second energy density is selected so that the second formal mask is not deformed or penetrated by the one shot of the first light and the predetermined number of shots of the second light.

4. The laser processing method according to claim 3, wherein a ratio of the second energy density to the first energy density is from 1:4 to 2:3.

5. The laser processing method according to claim 4, wherein the first insulating layer is comprised of a polyimide or a liquid crystal polymer, the second insulating layer is comprised of an epoxy adhesive or an acrylic adhesive, and the pulsed laser is a carbon dioxide laser.

6. A production method of a multilayer flexible printing wiring board that is comprised of a via for interlayer connection, wherein said via is formed by:

forming a via hole in accordance with the laser processing method of claim 5;

performing plating processing to form a plated layer on at least one wall that defines the via hole.

7. The laser processing method according to claim 2, wherein the first insulating layer is comprised of a polyimide or a liquid crystal polymer, the second insulating layer is comprised of an epoxy adhesive or an acrylic adhesive, and the pulsed laser is a carbon dioxide laser.

8. A production method of a multilayer flexible printing wiring board that is comprised of a via for interlayer connection, wherein said via is formed by:

forming a via hole in accordance with the laser processing method of claim 7;

performing plating processing to form a plated layer on at least one wall that defines the via hole.

9. The laser processing method according to claim 1, wherein the via hole is a step via hole that is constituted by an upper hole and a lower hole and the first insulating layer is further provided with a second conformal mask on a bottom surface thereof, the second conformal mask being a patterned conductive film that is used to form the lower hole of the step via hole, and the step via hole being formed as a result of the first and second irradiation steps, wherein the value of each of the first energy density and the second energy density is selected so that the second formal mask is not deformed or penetrated by the one shot of the first light and the predetermined number of shots of the second light.

10. The laser processing method according to claim 9, wherein a ratio of the second energy density to the first energy density is from 1:4 to 2:3.

11. The laser processing method according to claim 9, wherein the first insulating layer is comprised of a polyimide or a liquid crystal polymer, the second insulating layer is comprised of an epoxy adhesive or an acrylic adhesive, and the pulsed laser is a carbon dioxide laser.

12. A production method of a multilayer flexible printing wiring board that is comprised of a via for interlayer connection, wherein said via is formed by:

forming a via hole in accordance with the laser processing method of claim 11;

performing plating processing to form a plated layer on at least one wall that defines the via hole.

13. The laser processing method according to claim 1, wherein the first insulating layer is comprised of a polyimide or a liquid crystal polymer, the second insulating layer is comprised of an epoxy adhesive or an acrylic adhesive; and the pulsed laser is a carbon dioxide laser.

14. A production method of a multilayer flexible printing wiring board that is comprised of a via for interlayer connection, wherein said via is formed by:

forming a via hole in accordance with the laser processing method of claim 13;

performing plating processing to form a plated layer on at least one wall that defines the via hole.

15. A production method of a multilayer flexible printing wiring board that is comprised of a via for interlayer connection, wherein said via is formed by:

forming a via hole in accordance with the laser processing method of claim 1;

performing plating processing to form a plated layer on at least one wall that defines the via hole.

\* \* \* \* \*